United States Patent
Takahashi et al.

(10) Patent No.: US 11,417,863 B2
(45) Date of Patent: Aug. 16, 2022

(54) DISPLAY DEVICE AND PRODUCTION METHOD THEREFOR

(71) Applicant: SHARP KABUSHIKI KAISHA, Sakai (JP)

(72) Inventors: Jumpei Takahashi, Sakai (JP); Hisao Ochi, Sakai (JP); Tohru Senoo, Sakai (JP); Takeshi Hirase, Sakai (JP); Tohru Sonoda, Sakai (JP); Takashi Ochi, Sakai (JP); Akihiro Matsui, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 195 days.

(21) Appl. No.: 16/981,996

(22) PCT Filed: Mar. 27, 2018

(86) PCT No.: PCT/JP2018/012561
§ 371 (c)(1),
(2) Date: Sep. 17, 2020

(87) PCT Pub. No.: WO2019/186721
PCT Pub. Date: Oct. 3, 2019

(65) Prior Publication Data
US 2021/0159453 A1    May 27, 2021

(51) Int. Cl.
*H01L 51/52* (2006.01)
*H01L 27/32* (2006.01)
*H01L 51/56* (2006.01)

(52) U.S. Cl.
CPC ...... *H01L 51/5253* (2013.01); *H01L 27/3246* (2013.01); *H01L 27/3258* (2013.01); *H01L 51/56* (2013.01); *H01L 2227/323* (2013.01)

(58) Field of Classification Search
CPC ............. H01L 27/3246; H01L 27/3258; H01L 2227/323; H01L 51/5253; H01L 51/56
See application file for complete search history.

(56) References Cited

U.S. PATENT DOCUMENTS

| | | | |
|---|---|---|---|
| 2005/0269940 A1* | 12/2005 | Nishikawa | H01L 51/5246 313/500 |
| 2006/0270305 A1* | 11/2006 | Imamura | H05B 33/04 445/25 |
| 2012/0119235 A1* | 5/2012 | Nishiyama | H01L 51/5228 438/34 |
| 2019/0326375 A1* | 10/2019 | Ochi | H01L 51/5253 |
| 2020/0335564 A1* | 10/2020 | Ochi | H01L 27/3246 |

FOREIGN PATENT DOCUMENTS

JP    2011-146323 A    7/2011

\* cited by examiner

*Primary Examiner* — Shaun M Campbell
(74) *Attorney, Agent, or Firm* — ScienBiziP, P.C.

(57) ABSTRACT

A display device includes a TFT substrate including a flattening layer on a surface, a sealing film including a resin film that is an ink-jet resin film, and a first bank that surrounds the flattening layer, is covered with the resin film on an inner side, and has a frame shape. The flattening layer includes, on an entire periphery of a circumferential end portion thereof, a recessed and protruding portion provided with recesses and protrusions having sizes different on a first side and a second side in a plan view.

10 Claims, 12 Drawing Sheets

DISPLAY DEVICE AND PRODUCTION METHOD THEREFOR

TECHNICAL FIELD

The disclosure relates to a display device and a manufacturing method of the display device.

BACKGROUND ART

When a light-emitting element reacts with a small amount of moisture or oxygen, properties of the light-emitting element deteriorate and problems such as a reduction in reliability and a reduced lifetime of a display device to be acquired in the end occur. Thus, the light-emitting element is sealed by a sealing film including a resin film. However, a resin used in the resin film is discharged as a liquid ink droplet from an ink-jet coating device, and thus easily wet-spreads.

Here, for example, PTL 1 proposes a restriction for wet-spreading of a resin for sealing a light-emitting element, by forming a plurality of frame-shaped banks surrounding a flattening layer in which the light-emitting element is provided.

CITATION LIST

Patent Literature

PTL 1: JP 2011-146323 A (published Jul. 28, 2011)

SUMMARY

Technical Problem

The ink droplet discharged onto the flattening layer easily wet-spreads when the ink droplet flows down from the flattening layer, whereas a flow is more likely to stop at a portion of an end of an upper face of the flattening layer. As a result, there is a risk that the ink droplet may not spread at the portion of the end of the upper face of the flattening layer, and a portion that becomes a defect may occur. When such a defect occurs, a region that cannot be leveled by covering foreign matters with the resin film described above occurs. Thus, when moisture or the like permeates from the region described above into the resin film described above, and the light-emitting element deteriorates, there is a concern in that reliability of a display device to be acquired is reduced.

The disclosure has been contrived in view of the above-described problem and an object thereof is to provide a display device capable of preventing a reduction in reliability caused by a defect in a resin film, and a manufacturing method of the display device.

Solution to Problem

In order to solve the above-described problem, a display device according to one aspect of the disclosure includes: a circuit substrate including a flattening layer provided on a surface; a plurality of light-emitting elements provided on the flattening layer; a sealing film including a first inorganic film, a resin film in an upper layer overlying the first inorganic film, and a second inorganic film in an upper layer overlying the resin film, the sealing film sealing the light-emitting element; and a first bank surrounding the flattening layer, the first bank being covered with the resin film on an inner side, the first bank having a frame shape, where the flattening layer includes a first side and a second side orthogonal to the first side, and includes, on an entire periphery of a circumferential end portion of the flattening layer, a recessed and protruding portion provided with recesses and protrusions having sizes different on the first side and the second side in a plan view.

In order to solve the above-described problem, a manufacturing method of a display device according to one aspect of the disclosure includes: a circuit substrate including a flattening layer provided on a surface; a plurality of light-emitting elements provided on the flattening layer; a sealing film including a first inorganic film, a resin film in an upper layer overlying the first inorganic film, and a second inorganic film in an upper layer overlying the resin film, the sealing film sealing the light-emitting element; and a first bank surrounding the flattening layer, the first bank being covered with the resin film on an inner side, the flattening layer including a first side and a second side orthogonal to the first side is a manufacturing method of a display device that includes: a step of forming the flattening layer; a step of forming the first bank that surrounds the flattening layer; and a step of forming the resin film that covers the inner side of the first bank, where a recessed and protruding portion having different sizes in the plan view on the first side and the second side is formed on an entire periphery of a circumferential end portion of the flattening layer in the step of forming the flattening layer, and an ink droplet is dropped from an ink-jet coating device according to the recessed and protruding portion in a region surrounded by the first bank in the step of forming the resin film.

Advantageous Effects of Disclosure

According to one aspect of the disclosure, it is possible to provide a display device capable of preventing a reduction in reliability caused by a defect in a resin film, and a manufacturing method of the display device.

DESCRIPTION OF EMBODIMENTS

First Embodiment

One embodiment of the disclosure will be described below with reference to FIG. 1 to FIG. 11.

Configuration of Display Device

Figure 2:
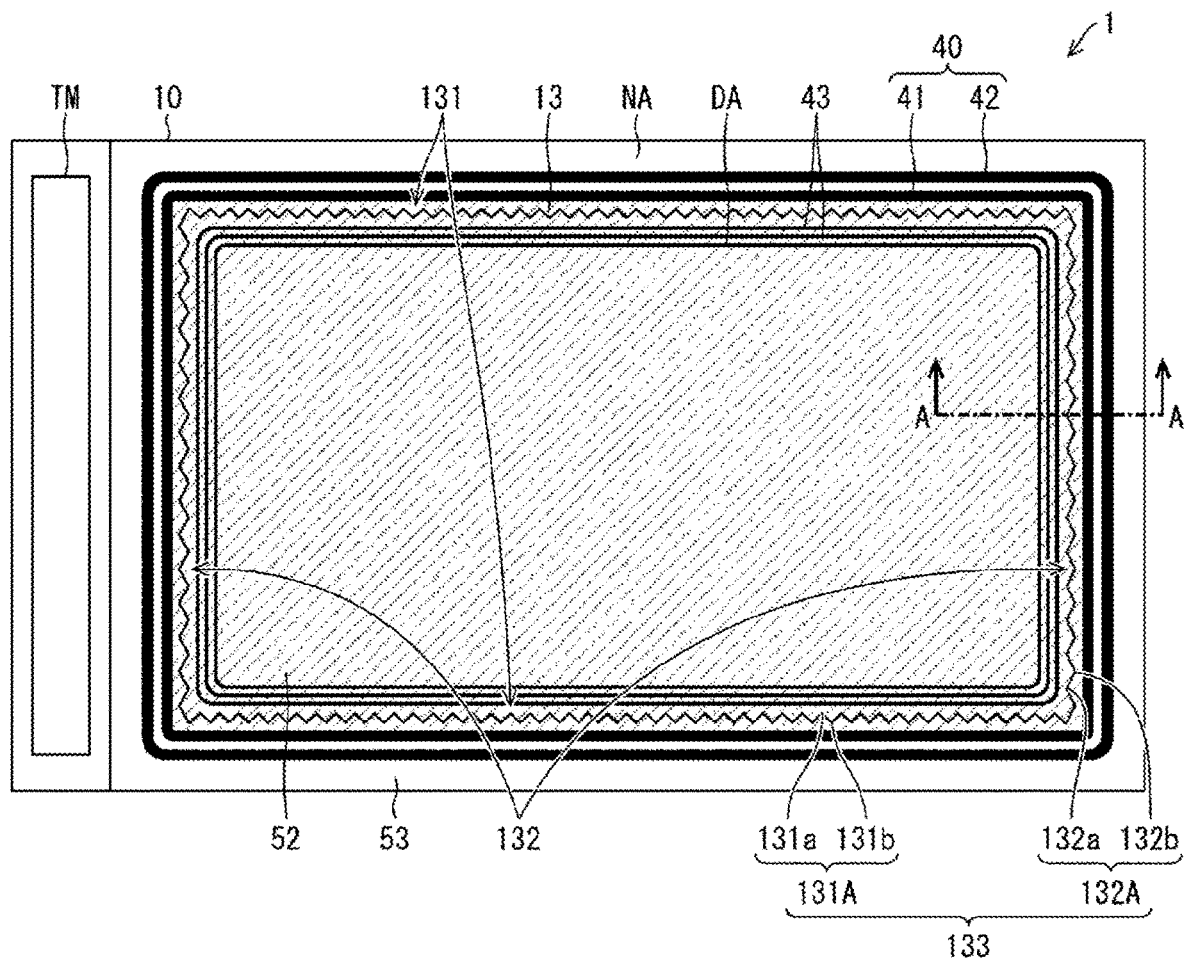
FIG. 2 is a plan view schematically illustrating a schematic configuration of the main portions of the display device according to the first embodiment.
Figure 3:
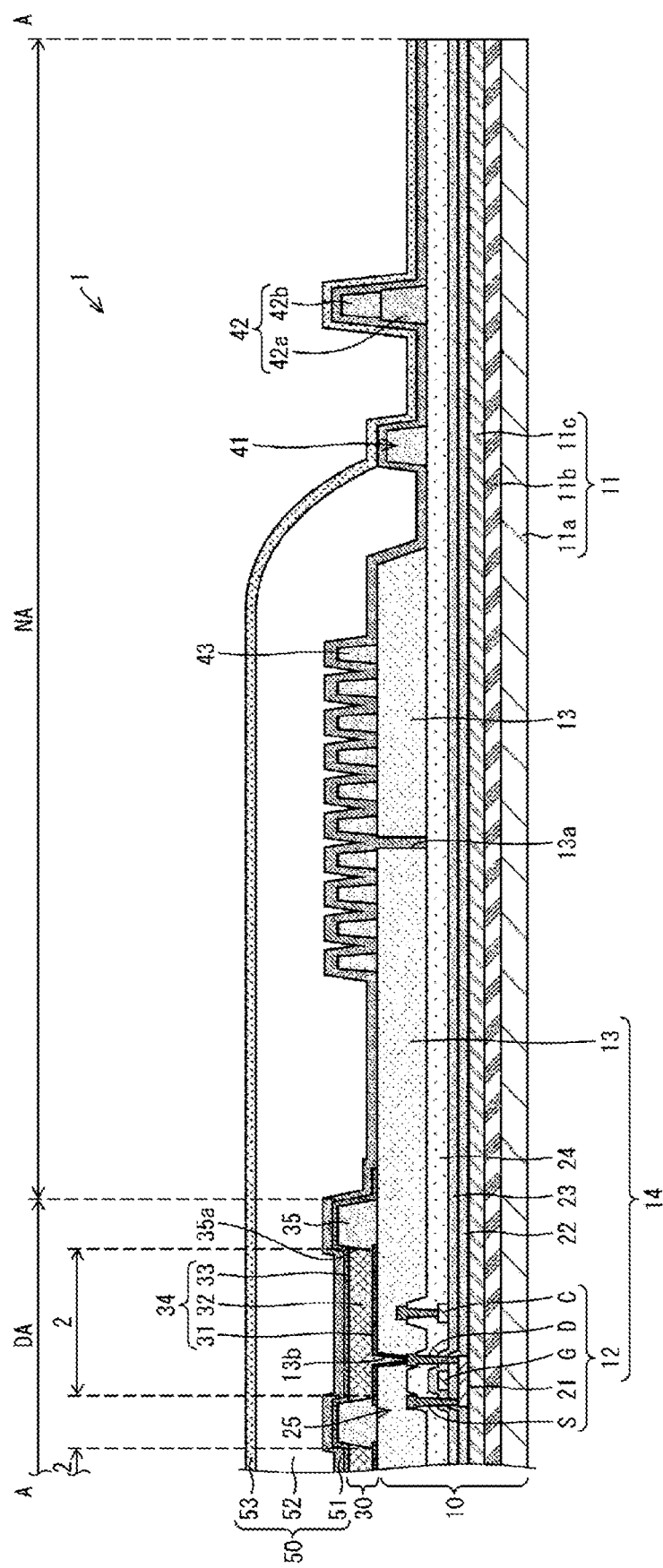
FIG. 3 is a cross-sectional view illustrating a schematic configuration of the main portions of the display device according to the first embodiment.

FIG. 2 is a plan view schematically illustrating a schematic configuration of main portions of a display device 1 according to the present embodiment. FIG. 3 is a cross-sectional view illustrating a schematic configuration of the main portions of the display device 1 according to the present embodiment. Note that FIG. 3 corresponds to a cross-sectional view seen in the direction of arrows on a line A-A of the display device 1 illustrated in FIG. 2.

As illustrated in FIG. 2 and FIG. 3, the display device 1 according to the present embodiment includes a Thin Film Transistor (TFT) substrate 10 (circuit substrate), a light-emitting element layer 30 that is provided on the TFT substrate 10 and includes a light-emitting element 34, a first bank 41 having a frame shape, a second bank 42 having a frame shape, a plurality of third banks 43, a sealing film 50, a cover body (not illustrated) such as a function film, an electronic circuit board (not illustrated), and the like. The second bank 42 includes a lower layer bank 42a and an upper layer bank 42b.

The TFT substrate 10 includes a support body 11 having insulating properties and a TFT layer 14 (circuit layer) provided on the support body 11. As illustrated in FIG. 3, for example, the support body 11 is a flexible layered film in which a lower face film 11a, a resin layer 11b, and a barrier layer 11c are provided in this order. Note that the resin layer 11b may be a glass substrate in the support body 11 other than this description.

Examples of a material of the lower face film 11a include polyethylene terephthalate and the like. Examples of a material of the resin layer 11b include a polyimide. The barrier layer 11c is a layer that prevents moisture or oxygen from penetrating into the TFT layer 14 and the light-emitting element layer 30, and can be formed of a silicon oxide film, a silicon nitride film, or a silicon oxynitride film, or a layered film of these, formed by chemical vapor deposition (CVD).

The TFT layer 14 includes a circuit portion 12 in which a TFT 25 (drive element) that drives the light-emitting element 34 and a plurality of wiring lines are formed, and a flattening layer 13 that covers the circuit portion 12. The TFT layer 14 has a configuration in which, for example, a semiconductor layer 21, an inorganic insulating layer 22, a first wiring line layer, an inorganic insulating layer 23, a second wiring line layer, an inorganic insulating layer 24, a third wiring line layer, and the flattening layer 13 are layered in this order.

The first wiring line layer includes, for example, a plurality of gate electrodes G, a plurality of gate wiring lines connected to the plurality of gate electrodes G, and the like. The second wiring line layer includes, for example, a plurality of capacitance electrodes C, a plurality of capacitance wiring lines connected to the plurality of capacitance electrodes C, and the like. The third wiring line layer includes, for example, a plurality of source electrodes S, a plurality of source wiring lines connected to the plurality of source electrodes S, a plurality of drain electrodes D, a plurality of second electrode connecting wiring lines connected to a second electrode 33 of the light-emitting element 34, and the like. The inorganic insulating layers 22, 23, and 24 are formed so as to cover the whole surface of the support body 11, for example. A region surrounded in a lattice pattern by the gate wiring lines and the source wiring lines is a pixel 2. The TFT 25 is provided for each of the pixels 2. The TFT 25 includes the semiconductor layer 21, the gate electrode G, the inorganic insulating layer 22, the source electrode S, and the drain electrode D.

The flattening layer 13 levels a step on the TFT 25 and the third wiring line layer. As illustrated in FIG. 2 and FIG. 3, the flattening layer 13 is provided in an island shape on a surface of the TFT layer 14 from an active area DA to a non-active area NA. The active area DA is a region where the light-emitting element 34 is provided, and is a pixel region (display region) where the plurality of pixels 2 are provided. The non-active area NA is a peripheral region (frame region) surrounding a periphery of the active area DA.

As illustrated in FIG. 3, a contact hole 13b that electrically connects the first electrode 31 and the TFT 25 is formed in the flattening layer 13 in the active area DA. In the flattening layer 13 in the non-active area NA, a slit 13a for cutting off a path of moisture penetration into the active area DA is formed in a frame shape in a plan view so as to surround the active area DA.

As illustrated in FIG. 2, the flattening layer 13 has a quadrangular shape having two first sides 131 parallel to each other in the up-down direction of FIG. 2, and two second sides 132 parallel to each other in the left-right direction in FIG. 2 that are orthogonal to the first sides 131 in the plan view. In the plan view, a recessed and protruding portion 133 having sizes (pitch and depth) of recesses and protrusions different on the first side 131 and the second side 132 is provided on a circumferential end portion of the flattening layer 13 across the entire periphery of the circumferential end portion so as to face the first bank 41. The recessed and protruding portion 133 includes a recessed and protruding portion 131A formed of a recessed portion 131a and a protruding portion 131b provided on the first side 131, and a recessed and protruding portion 132A formed of a recessed portion 132a and a protruding portion 132b provided on the second side 132.

The recessed portions 131a and 132a are recessed in an in-plane direction toward the inside of the flattening layer 13 (a side opposite to the first bank 41) in the plan view. The protruding portions 131b and 132b protrude in the in-plane direction toward the outside of the flattening layer 13 (the first bank 41 side) in the plan view. The recessed and protruding portions 131A and 132A each have, for example, a zigzag shape.

A terminal portion TM including a plurality of terminals for external connection that are connected to an electronic circuit board (not illustrated) such as an IC chip is provided on an end portion of the TFT layer 14.

The semiconductor layer 21 is formed of, for example, low temperature polysilicon or an oxide semiconductor. The inorganic insulating layer 22 can be formed of a silicon oxide film or a silicon nitride film, or a layered film of these, formed by CVD, for example. The first wiring line layer, the second wiring line layer, the third wiring line layer, and the terminal portion TM are formed of, for example, a single-layer film or a layered film of a known metal. The flattening layer 13 can be formed of a photosensitive resin such as polyimide resin and acrylic resin, for example.

As illustrated in FIG. 3, the light-emitting element layer 30 includes the plurality of light-emitting elements 34 provided so as to correspond to the respective pixels 2, and an edge cover 35. One picture element that is the smallest unit of the display is formed of the pixels 2 of red (R), green (G), and blue (B), for example.

The light-emitting element 34 includes a first electrode 31 provided on the flattening layer 13, the second electrode 33 provided above the first electrode 31, and a function layer 32 that is provided between the first electrode 31 and the second electrode 33 and includes at least a light-emitting layer.

The first electrode 31 is electrically connected to the TFT 25. In this way, each of the TFTs 25 drives each of the light-emitting elements 34. The first electrode 31 is an anode electrode (pattern anode electrode) formed in an island shape for each of the pixels 2, and the second electrode 33 is a cathode electrode (common cathode electrode) formed in a solid-like shape common to all of the pixels 2. However, the first electrode 31 may be a cathode electrode, and the second electrode 33 may be an anode electrode. A known electrode material is used for the first electrode 31 and the second electrode 33.

The function layer 32 between the first electrode 31 and the second electrode 33 is, for example, an EL layer. When the display device 1 is an organic EL display device, an organic layer is used for the function layer 32. The function layer 32 is formed by, for example, layering a hole transport layer, a light-emitting layer, and an electron transport layer in this order from the lower layer side. Note that the function layer 32 may include at least a light-emitting layer. Further, the function layer 32 may include a layer other than the above-mentioned layer. The function layer 32 may be formed in an island shape for each of the pixels 2, or may be formed in a solid-like shape as a common layer common to the plurality of pixels 2.

The edge cover 35 is a bank (protruding portion) in a lattice pattern in the plan view that covers an edge of the first electrode 31, and includes an opening 35a that exposes a part of the first electrode 31. The edge cover 35 is disposed between the adjacent pixels 2 on the flattening layer 13 in the active area DA, and the opening 35a serves as a light-emitting region for each of the pixels 2. The edge cover 35 prevents an electrical field concentration and a short-circuit between the first electrode 31 and the second electrode 33, and also functions as a pixel separation layer. For example, the photosensitive resin exemplified above may be used for the edge cover 35.

The sealing film 50 seals the light-emitting element layer 30, and prevents water, oxygen, and the like from penetrating into an interior of the light-emitting element layer 30. The sealing film 50 includes a first inorganic film 51 in an upper layer overlying the second electrode 33, a resin film 52 in an upper layer overlying the first inorganic film 51, and a second inorganic film 53 in an upper layer overlying the resin film 52.

The first inorganic film 51 and the second inorganic film 53 function as a barrier layer that prevents deterioration of the light-emitting element 34 caused by moisture or oxygen. The first inorganic film 51 and the second inorganic film 53 can be formed of a silicon oxide film, a silicon nitride film, or a silicon oxynitride film, or a layered film of these, formed by CVD, for example.

The resin film 52 performs stress relief of the first inorganic film 51 and the second inorganic film 53, leveling by filling a stepped portion and foreign matters on the surface of the light-emitting element layer 30, filling of pin holes, and the like. The resin film 52 is an ink film (ink-jet resin film) formed by film-forming ink 152 (see (d) of FIG. 5) including a resin, and is a transparent organic insulating film that is thicker than the first inorganic film 51 and the second inorganic film 53. The resin film 52 is formed by, for example, applying the ink 152 to a region on the first inorganic film 51 surrounded by the first bank 41 by an ink-jet method or the like, and curing the ink 152 by UV curing or the like. Examples of the resin include the photosensitive resin exemplified above.

A cover body (not illustrated) such as a function film may be provided on the sealing film 50 with an adhesive layer (not illustrated) interposed therebetween. The cover body is a function layer having at least one of a protection function, an optical compensation function, and a touch sensor function.

The first bank 41 and the second bank 42 are a frame-shaped dam bank (protruding portion) that functions as a dam portion (ink stopper) that blocks a flow of the ink 152 by holding back the ink 152 used for the resin film 52. As illustrated in FIG. 2 and FIG. 3, the first bank 41 and the second bank 42 are disposed in a double-frame shape on the inorganic insulating layer 24 provided with the flattening layer 13 in the non-active area NA so as to surround the flattening layer 13. The flattening layer 13, the first bank 41, and the second bank 42 are formed on the same layer (the same plane).

The first bank 41 and the second bank 42 each have a frame shape formed by a continuous line. The first bank 41 is provided so as to surround the flattening layer 13 and face the flattening layer 13. The second bank 42 is provided so as to surround the first bank 41.

An inner side of the first bank 41 is covered with the resin film 52. A peripheral portion of the resin film 52 is in contact with the first bank 41. An edge of the resin film 52 is defined by the first bank 41.

The second bank 42 is formed such that a height of the second bank 42 is higher than a height of the first bank 41. Note that the height of the first bank 41 and the height of the second bank 42 refer to a height from a surface of an underlayer (the inorganic insulating layer 24 in the example illustrated in FIG. 3) on which the first bank 41 and the second bank 42 are provided to an upper face of each of the first bank 41 and the second bank 42.

The third bank 43 is a regulating bank (protruding portion) that regulates wet-spreading of the ink 152 by functioning as a resistance when the ink 152 passes through the third bank 43, and thus stepwisely reducing a flow rate of the ink 152 during film formation of the resin film 52. Further, the third bank 43 also functions as a mask spacer on which a vapor deposition mask is placed during formation of each layer (vapor deposition layer) included in the function layer 32.

The third bank 43 is formed in a frame shape in the non-active area NA on the flattening layer 13, and is disposed in a multiple-frame shape so as to surround the active area DA. Note that, in FIG. 2, the number of the third banks 43 is reduced. The third bank 43 may be formed in a continuous frame shape or may be formed in an intermittent frame shape.

Examples of a material of the first bank 41 to the third bank 43 include the photosensitive resin exemplified above. In the example illustrated in FIG. 2, a bank formed from the same material as that of the edge cover 35 is formed as the first bank 41 and the third bank 43. Further, as the second bank 42, a two-stepped bank is formed by layering the upper layer bank 42b formed from the same material as that of the edge cover 35, the first bank 41, and the third bank 43 on the lower layer bank 42a formed from the same material as that of the flattening layer 13. Note that an end face of each of the edge cover 35, the first bank 41 to the third bank 43, and the flattening layer 13 preferably has a forwardly tapered shape in order to obtain good covering of a formation surface where each of the edge cover 35, the first bank 41 to the third bank 43, and the flattening layer 13 is formed, for example. Thus, for example, a positive-working photosensitive resin such as an acrylic resin and a polyimide resin, for example, can be suitably used for a material of the edge cover 35, the first bank 41 to the third bank 43, and the flattening layer 13.

Further, in FIG. 2 and FIG. 3, an example of a case is illustrated in which the first bank 41 and the second bank 42 surround the flattening layer 13 as a double-structure. However, the present embodiment is not limited to this configuration, and the dam portion may further include a bank other than the first bank 41 and the second bank 42.

Manufacturing Method of Display Device 1

Figure 4:
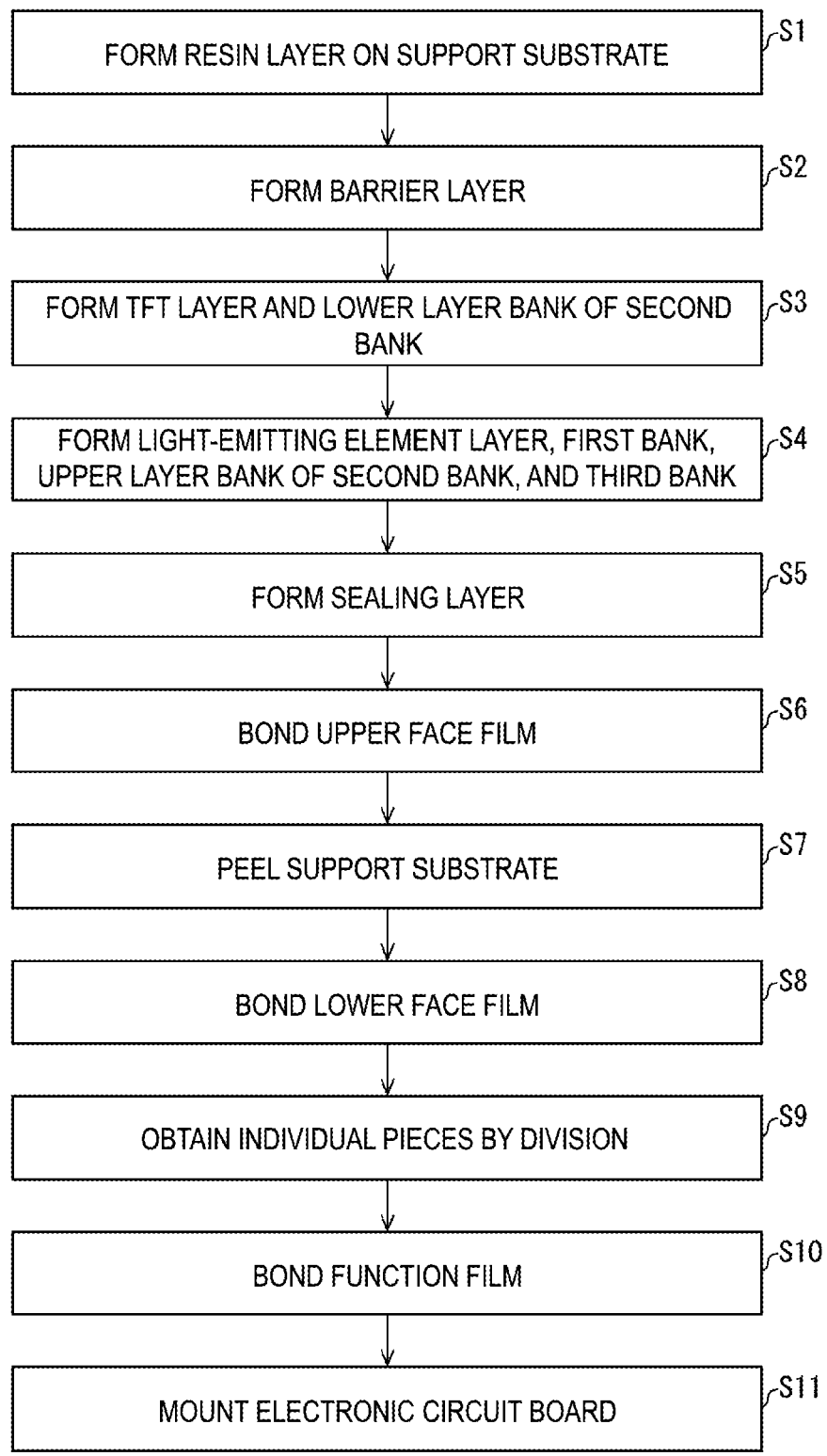
FIG. 4 is a flowchart illustrating an example of a manufacturing method of the display device according to the first embodiment.
Figure 5:
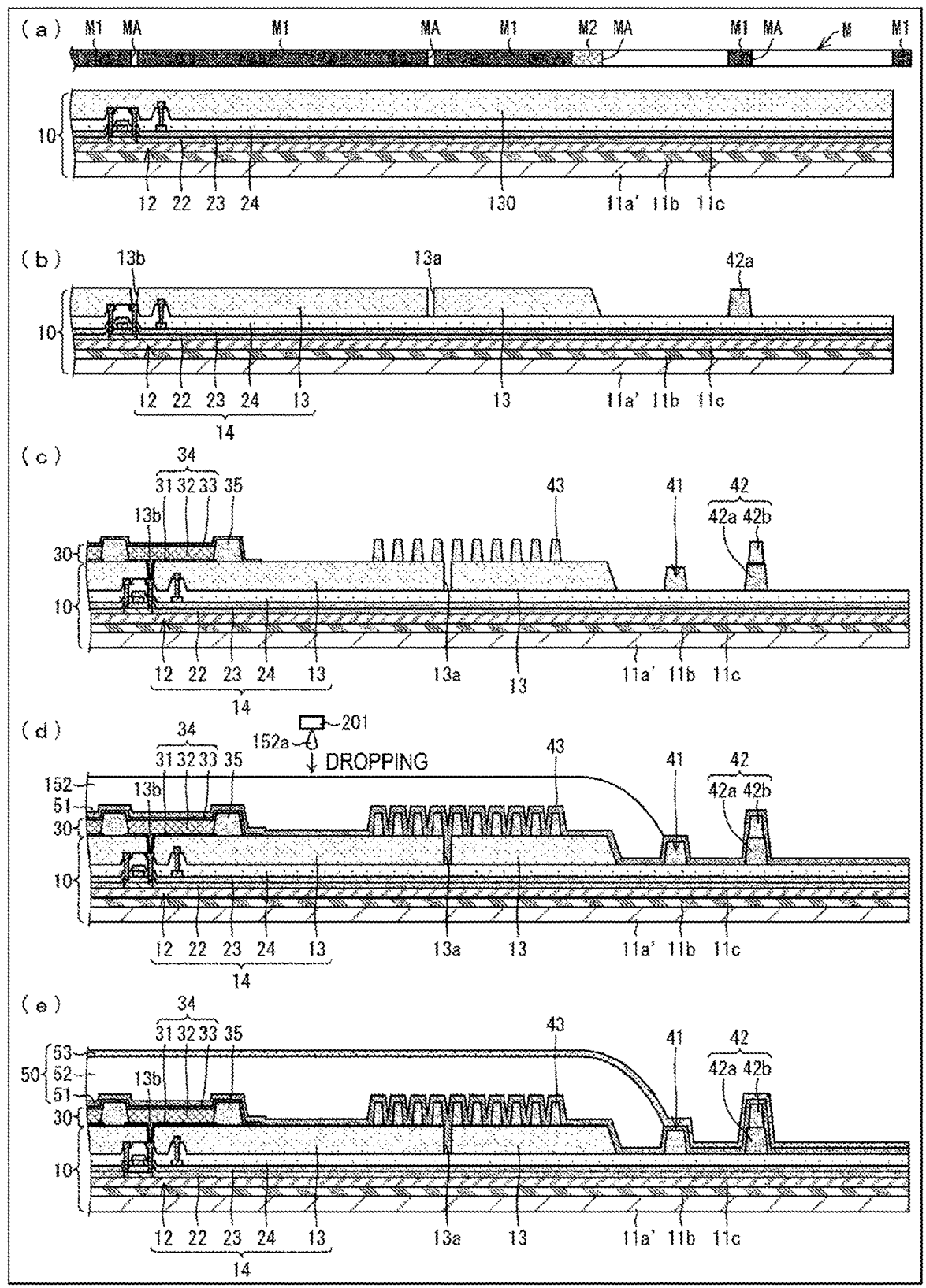
FIGS. 5(a) to 5(e) are cross-sectional views of main portions illustrating, in a sequence of steps, some steps for manufacturing the display device according to the first embodiment.

FIG. 4 is a flowchart illustrating an example of a manufacturing method of the display device 1 according to the present embodiment. (a) to (e) of FIG. 5 are cross-sectional views of main portions illustrating, in a sequence of steps, some steps for manufacturing the display device 1 according to the present embodiment. When the display device 1 is, for example, a flexible display device, as illustrated in FIG. 4, the steps for manufacturing the display device 1 include a step of forming a resin layer (S1), a step of forming a barrier layer (S2), a step of forming a TFT layer and a lower layer bank of a second bank (S3), a step of forming a light-emitting element layer, a first bank, an upper layer bank of a second bank, and a third bank (S4), a step of forming a sealing layer (S5), a step of bonding an upper face film (S6), a step of peeling a support substrate (S7), a step of bonding a lower face film (S8), a step of obtaining individual pieces of a layered body (S9), a step of bonding a function film (S10), and a step of mounting an electronic circuit board (S11).

In the steps for manufacturing the display device 1, first, as illustrated in FIG. 2 and (a) of FIG. 5, the resin layer 11b is formed on a support substrate 11a' having translucency (for example, a mother substrate formed of a glass substrate or the like) (S1). Next, the barrier layer 11c is formed on the resin layer 11b (S2). Next, the TFT layer 14 and the lower layer bank 42a of the second bank 42 are formed (S3).

Figure 6:
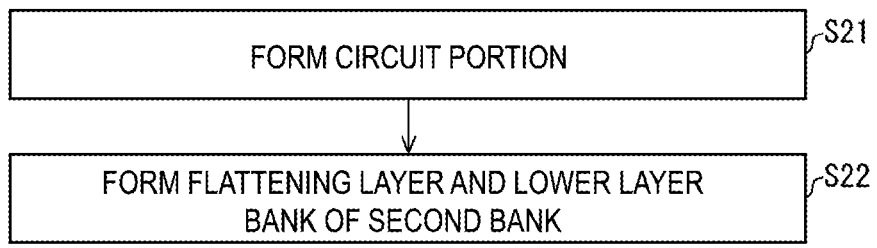
FIG. 6 is a flowchart illustrating an example of a step of forming a TFT layer and a lower layer bank of a second bank according to the first embodiment.

FIG. 6 is a flowchart illustrating an example of the step of forming a TFT layer and a lower layer bank of a second bank (S3). The step (S3) includes, for example, a step of forming a circuit portion (S21) and a step of forming a flattening layer and a lower layer bank of a second bank (S22).

The circuit portion 12 includes the plurality of TFTs 25 and the plurality of wiring lines described above that are covered with the flattening layer 13. In the step (S3) described above, first, as illustrated in (a) of FIG. 5, the circuit portion 12 including the plurality of TFTs 25 and the plurality of wiring lines is formed by a known method (S21). Subsequently, the flattening layer 13 and the lower layer bank 42a of the second bank 42 are formed (S22).

In the step (S22) described above, first, as illustrated in (a) of FIG. 5, a photosensitive resin 130 is applied to the inorganic insulating layer 24 by a known method so as to cover the circuit portion 12. Next, the flattening layer 13 and the lower layer bank 42a of the second bank 42 formed of the photosensitive resin 130 are patterned and formed by photolithography and the like using a multi-gray scale mask as an exposure mask M, for example.

(a) of FIG. 5 illustrates an example of a case in which a halftone mask including a transparent portion MA, a light blocking portion Ml, and a halftone portion M2 (multi-gray scale portion) is used as the multi-gray scale mask described above, and a positive-working photosensitive resin is used for the photosensitive resin 130.

The transparent portion MA is provided so as to face a region in the photosensitive resin 130 except for the formation region of the flattening layer 13 and the lower layer bank 42a, and face the formation region of the slit 13a and the contact hole 13b (see (b) of FIG. 5) in the flattening layer 13. The light blocking portion M1 covers, in the photosensitive resin 130, the formation region of the flattening layer 13 except for the formation region of the slit 13a, the contact hole 13b, and the uneven structure of the edge of the flattening layer 13, and the formation region of the lower layer bank 42a. The halftone portion M2 covers the formation region of the recessed and protruding portion 133 of the flattening layer 13 in the photosensitive resin 130. The halftone portion M2 has different transmittances in the formation region of the first side 131 of the flattening layer 13 and the formation region of the second side 132. The transmittance of the halftone portion M2 covering the formation region of the first side 131 is greater than the transmittance of the halftone portion M2 covering the formation region of the second side 132.

When the photosensitive resin 130 described above is irradiated with light such as ultraviolet light via the exposure mask M, the photosensitive resin 130 is irradiated with light passing through each of the transparent portion MA and the halftone portion M2. As a result, in the photosensitive resin 130, the region facing the transparent portion MA is exposed and the region facing the halftone portion M2 is half-exposed. Subsequently, as illustrated in (b) of FIG. 5, the flattening layer 13 and the lower layer bank 42a formed of the photosensitive resin 130 are simultaneously patterned and formed by performing developing. At this time, due to interference of the light by the half exposure and a resolution of an exposure device, the flattening layer 13 including the circumferential end portion provided with the recessed and protruding portion 133 including a gentle end face with an inclination angle can be formed. Note that a gray tone mask may be used as the multi-gray scale mask described above. Of course, the flattening layer 13 and the lower layer bank 42a may be formed by etching, double exposure, or the like, and the flattening layer 13 and the lower layer bank 42a may be formed in different steps by using masks different from each other.

Figure 7:
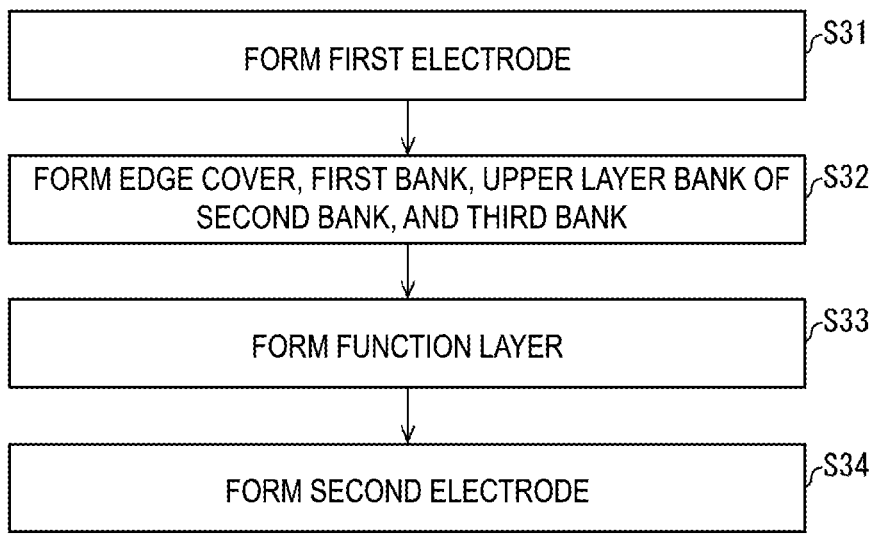
FIG. 7 is a flowchart illustrating an example of a step of forming a light-emitting element layer, an upper layer bank, and a third bank according to the first embodiment.

Next, the light-emitting element layer 30, the first bank 41, the upper layer bank 42b of the second bank 42, and the third bank 43 are formed (S4). FIG. 7 is a flowchart illustrating an example of a step of forming a light-emitting element layer, an upper layer bank, and a third bank (S4). The step (S4) includes, for example, a step of forming a first electrode (S31), a step of forming an edge cover, an upper layer bank, and a third bank (S32), a step of forming a function layer (S33), and a step of forming a second electrode (S34).

In the step (S4) described above, as illustrated in (c) of FIG. 5, first, the first electrode 31 is formed on the flattening layer 13 formed in the step (S3) (S31). Next, an organic film (not illustrated) formed of, for example, a positive-working photosensitive resin is formed on the TFT layer 14 so as to cover the first electrode 31. Next, the edge cover 35, the first bank 41, the upper layer bank 42b of the second bank 42, and the third bank 43 formed of the organic film described above are patterned and formed by photolithography or the like. Subsequently, the function layer 32 is formed (S33). Next, the second electrode 33 is formed (S34). As a result, the light-emitting element layer 30 including the light-emitting element 34 and the third bank 43 are formed on the flattening layer 13, and the first bank 41 and the second bank 42 including the lower layer bank 42a and the upper layer bank 42b are also formed on the inorganic insulating layer 24.

In this way, the step of forming a dam portion includes, for example, a first bank formation step of forming the first bank 41, and a second bank formation step including a lower layer bank formation step of forming the lower layer bank 42a of the second bank 42 and an upper layer bank formation step of forming the upper layer bank 42b of the second bank 42. In this case, as described above, the step of forming a flattening layer in the step of forming a TFT layer and the step of forming a lower layer bank of a second bank in the step of forming a dam portion may be simultaneously performed. Further, the step of forming a light-emitting element layer and the step of forming a first bank and the step of forming an upper layer bank of a second bank in the step of forming a dam portion may be simultaneously performed. Note that, of course, the edge cover 35, the first bank 41, the second bank 42 or the upper layer bank 42b of the second bank 42, and the third bank 43 may be simultaneously formed by using the same material, or may be formed in different steps by using materials different from each other or masks different from each other.

Figure 8:
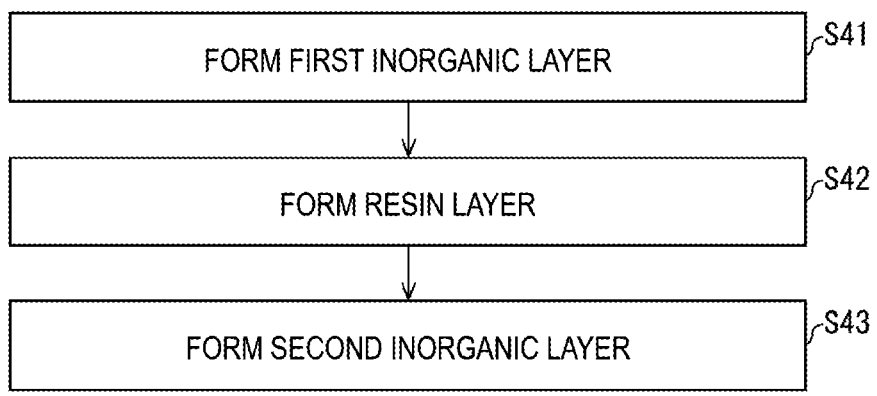
FIG. 8 is a flowchart illustrating an example of a step of forming a sealing layer according to the first embodiment.

Next, the light-emitting element layer 30 formed in the step (S4) is sealed with the sealing film 50 (S5). FIG. 8 is a flowchart illustrating an example of a step of forming a sealing layer (S5). The step (S5) includes, for example, a step of forming a first inorganic film (S41), a step of forming a resin layer (S42), and a step of forming a first inorganic film (S43).

In the step (S5) described above, first, as illustrated in (d) of FIG. 5, the first inorganic film 51 is formed by CVD or the like (S41). Next, the resin film 52 is formed on the first inorganic film 51 (S42). In the step (S42) described above, by dropping an ink droplet 152a from an ink-jet coating device 200 onto a region surrounded by the first bank 41, the ink 152 that is a material of the resin film 52 is applied to the entire region. Next, the ink 152 described above is irradiated with ultraviolet light to cure the ink 152. As a result, the resin film 52 formed of the ink 152 is formed. Subsequently, as illustrated in (e) of FIG. 5, the second inorganic film 53 is formed by CVD or the like so as to cover the resin film 52 (S43). The first inorganic film 51 and the second inorganic film 53 are formed on the entire surface of the active area DA and the non-active area NA other than the terminal portion TM so as to sandwich the resin film 52 between the first inorganic film 51 and the second inorganic film 53.

Next, an upper face film (not illustrated) is bonded to the sealing film 50 formed in the step (S5) described above (S6). Next, a lower face of the resin layer 11b is irradiated with laser light over the support substrate 11a', and the support substrate 11a' is peeled from the resin layer 11b (S7). Next, the lower face film 11a illustrated in FIG. 3 is bonded to the lower face of the resin layer 11b (S8). Next, the layered body obtained in the step (S8) described above is divided, and a plurality of individual pieces are obtained (S9). Next, a function film (not illustrated) is bonded to the obtained individual pieces (S10). Next, an electronic circuit board (not illustrated) is mounted on a terminal for external connection in the terminal portion TM, and thus the display device 1 illustrated in FIG. 2 and FIG. 3 is obtained (S11). Note that each of the steps is performed by a display device manufacturing apparatus.

Shape of Recessed and Protruding Portions 131A and 132A, and Method for Forming Resin Film 52

Figure 1:
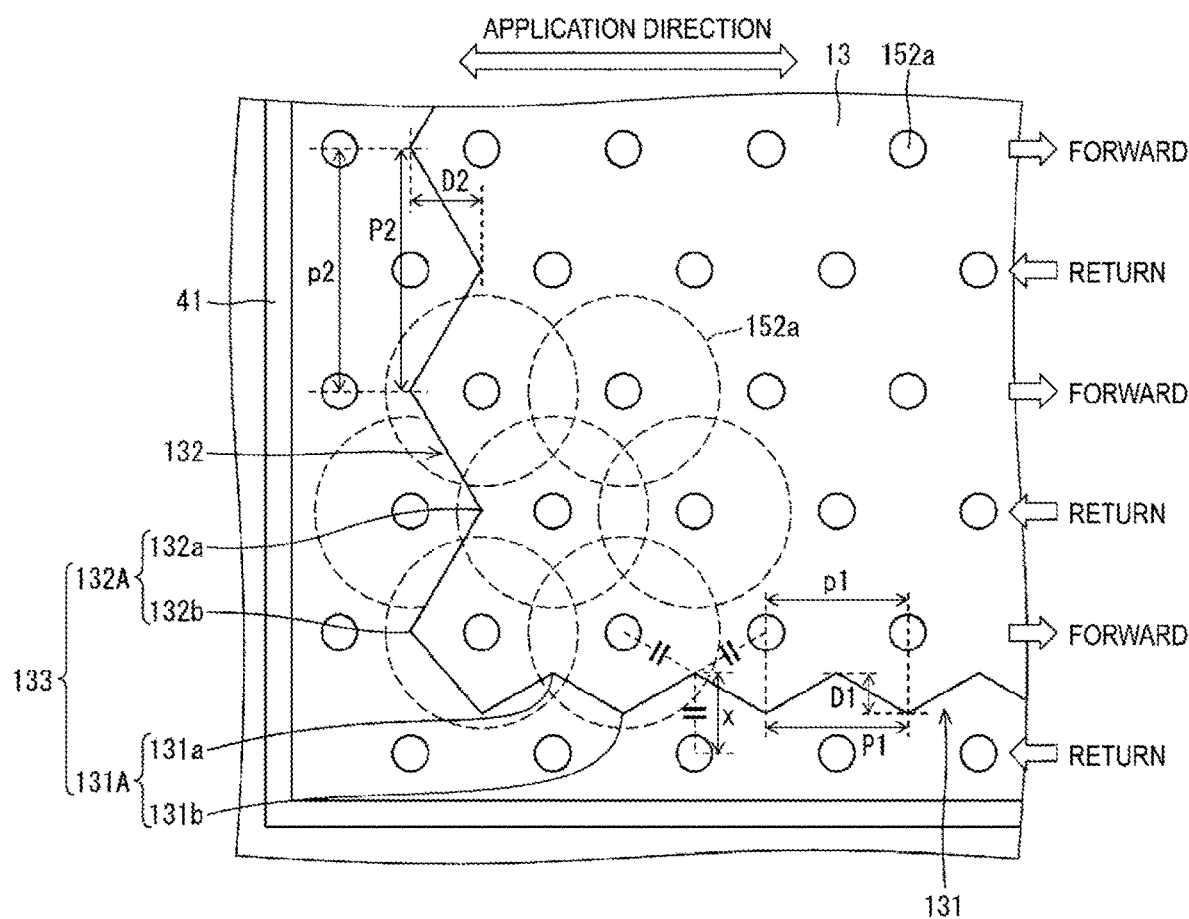
FIG. 1 is an enlarged plan view illustrating a schematic configuration of main portions of a display device according to a first embodiment together with an arrangement of ink droplets when a resin film is film-formed.
Figure 9:
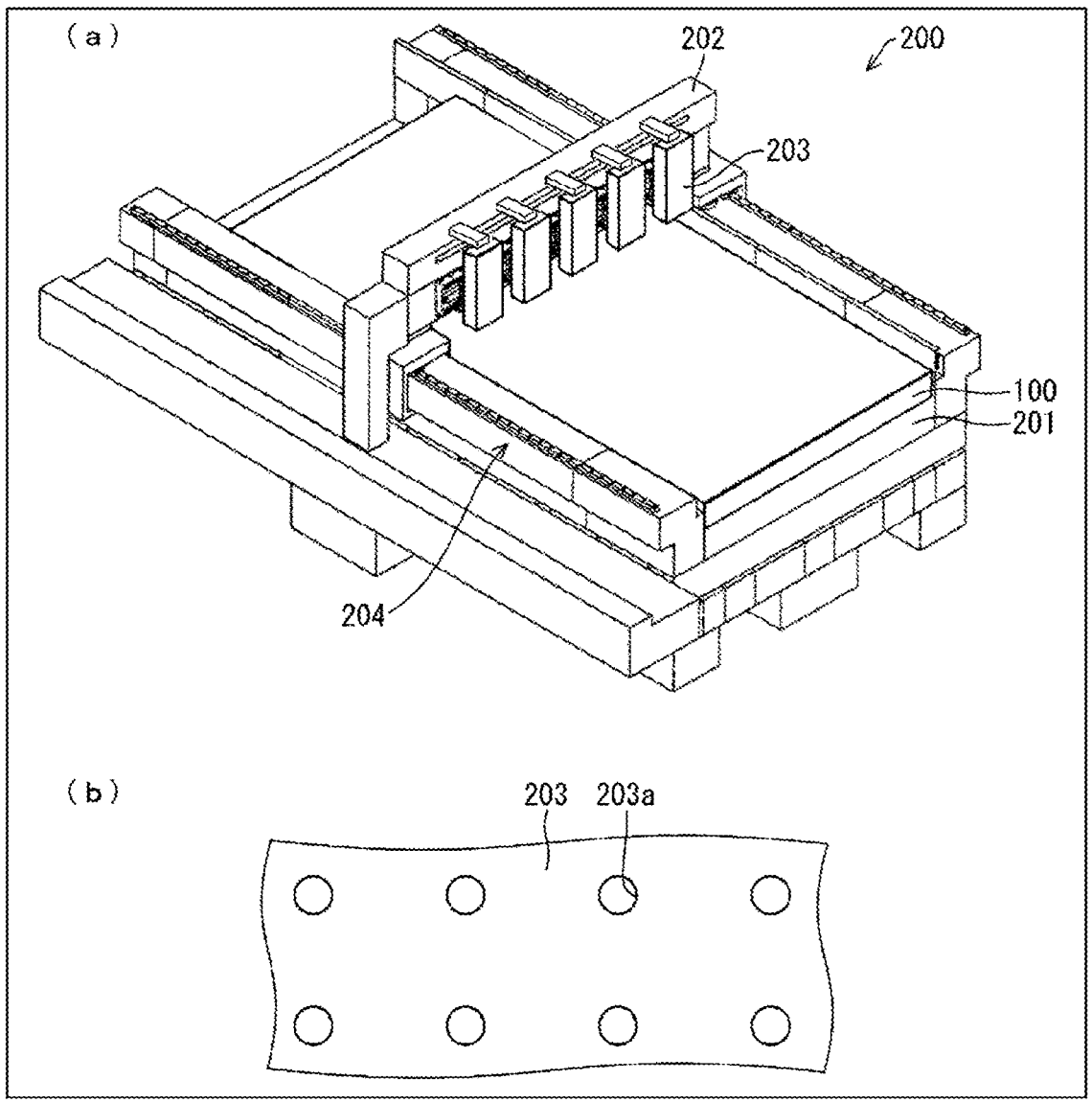
FIG. 9(a) is a perspective view illustrating an appearance of an ink-jet coating device according to the first embodiment.
FIG. 9(b) is a bottom view illustrating a configuration of main portions of a bottom surface of an ink-jet head of the ink-jet coating device.
Figure 10:
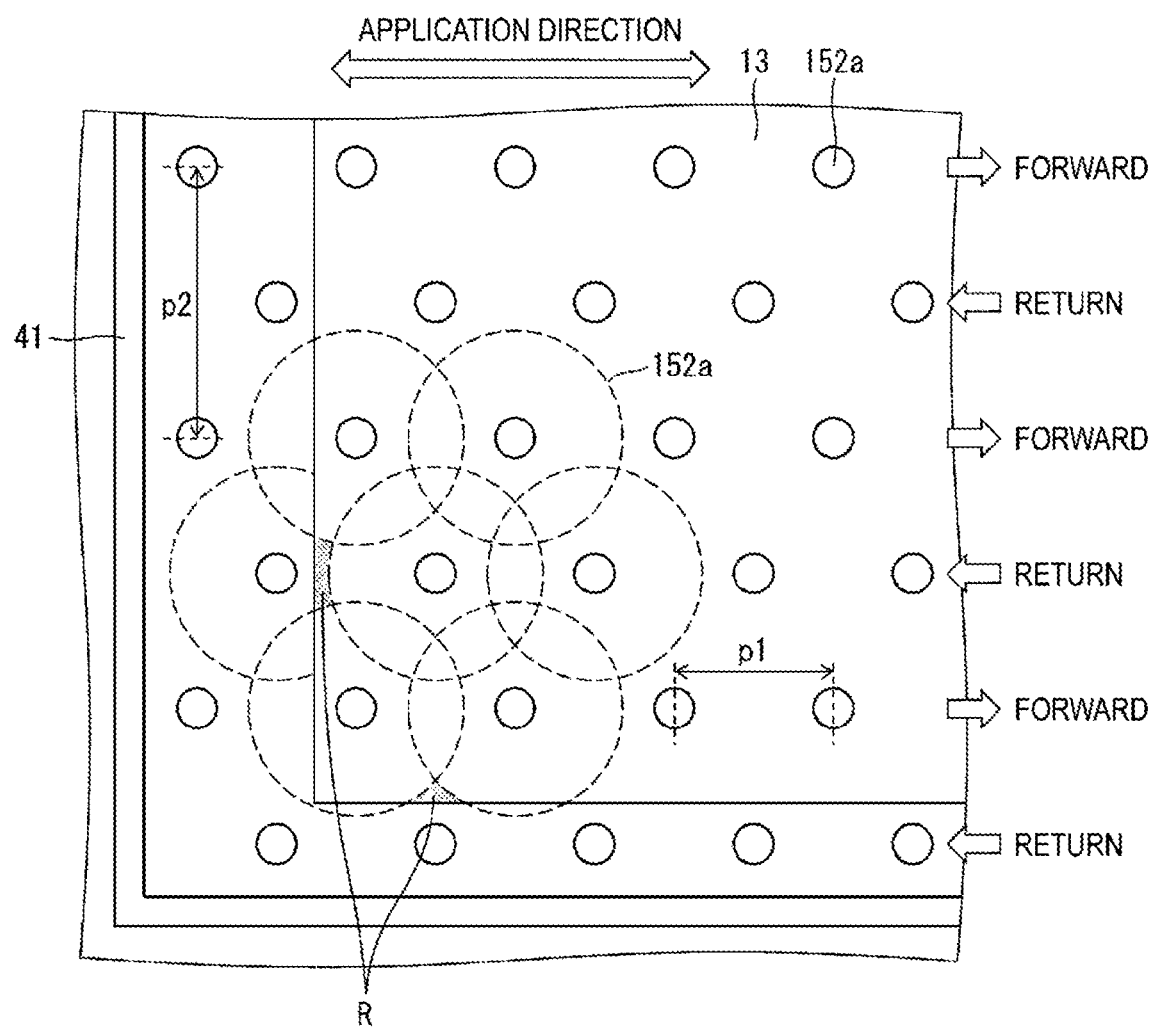
FIG. 10 is a plan view illustrating a spread of ink droplets when a recessed and protruding portion is not provided on a circumferential end portion of a flattening layer.

FIG. 1 is an enlarged plan view illustrating a schematic configuration of the main portions of the display device 1 according to the present embodiment together with an arrangement of the ink droplets 152a when the resin film 52 is film-formed. (a) of FIG. 9 is a perspective view illustrating an appearance of the ink-jet coating device 200 according to the present embodiment. (b) of FIG. 9 is a bottom view illustrating a configuration of main portions of a bottom surface of an ink-jet head 203. FIG. 10 is a plan view illustrating a spread of the ink droplets 152a when the recessed and protruding portion 133 is not provided on the circumferential end portion of the flattening layer 13.

The ink-jet coating device 200 is a film formation apparatus that forms the resin film 52 in the sealing film 50 by discharging the ink droplet 152a of the ink 152 in step S42.

As illustrated in (a) of FIG. 9, the ink-jet coating device 200 includes a stage 201 on which a substrate including the first inorganic film 51 film-formed thereon is placed as a film formed substrate 100, and a gantry 202 traversing above the stage 201. For example, the plurality of ink-jet heads 203 are provided on a side surface of the gantry 202. As illustrated in (b) of FIG. 9, a plurality of nozzles 203a for discharging (dropping) the ink droplets 152a are provided on a bottom surface (a surface facing the film formed substrate 100) of the ink-jet head 203. Note that the number of the ink-jet heads 203 and the number of the nozzles 203a are not particularly limited.

The gantry 202 reciprocates along a direction (first direction) parallel to the first side 131 of the flattening layer 13, which is an application direction of the ink 152, by a gantry slide mechanism 204 coupled to the stage 201. As illustrated in FIG. 1 and FIG. 10, the ink droplet 152a is dropped onto the region surrounded by the first bank 41. The ink-jet coating device 200 drops the ink droplets 152a in forward and return directions such that, for example, the ink droplets 152a are arranged in a zigzag pattern with a half of application pitches of the ink droplets 152a being staggered. This is because, when the ink droplets 152a are arranged in a lattice pattern, a defect is more likely to occur between the ink droplets 152a, and film thickness unevenness is more likely to occur in the resin film 52 to be film-formed.

The pitch between the ink droplets 152a in the direction parallel to the first side 131 of the flattening layer 13 (i.e., the direction parallel to the application direction of the ink droplets 152a, the first direction) is equal to an application pitch p1 (μm) that is an application period of the ink droplets 152a in the ink-jet coating device 200. Further, the pitch between the ink droplets 152a in a direction parallel to the second side 132 of the flattening layer 13 (i.e., a direction perpendicular to the application direction of the ink droplets 152a, a second direction) is equal to a nozzle pitch p2 (μm) of the nozzles 203a in the ink-jet coating device 200. Note that the pitch between the ink droplets 152a indicates a distance between the centers of the adjacent ink droplets 152a. Further, the nozzle pitch p2 indicates a distance between the centers of the adjacent nozzles 203a.

The ink droplets 152a dropped onto the film formed substrate 100 spread radially from a state indicated by a solid line in FIG. 10 to a state indicated by a dotted line in FIG. 10. However, the ink droplet 152a dropped onto the lower side of the flattening layer 13 (between the flattening layer 13 and the first bank 41) cannot spread on the upper side of the flattening layer 13 because the end face of the flattening layer 13 has a tapered shape. Thus, when the recessed and protruding portion 133 is not provided on the circumferential end portion of the flattening layer 13, the ink droplet 152a does not spread on the circumferential end portion of the flattening layer 13, and a region R being a defect occurs, as indicated by diagonal lines in FIG. 10.

Thus, in the present embodiment, the recessed and protruding portion 133 is provided on the circumferential end portion of the flattening layer 13 such that the region R where the ink droplet 152a does not spread in this manner is removed. In other words, according to the present embodiment, the recessed and protruding portion 133 is provided on the circumferential end portion of the flattening layer 13 so as to have an edge within the range in which the ink droplet 152a spreads.

The pitch of the recesses and the protrusions (the recessed portion 132a and the protruding portion 132b) in the recessed and protruding portion 132A is defined by the nozzle pitch p2. The depth of the recesses and the protrusions in the recessed and protruding portion 132A described above and the pitch of the recesses and the protrusions in the recessed portion 131a and the protruding portion 131b) in the recessed and protruding portion 131A are defined by the application pitch p1. The depth of the recesses and the protrusions in the recessed and protruding portion 131A described above is defined by the nozzle pitch p2 and the application pitch p1. Further, the application pitch p1 is defined by a film thickness t (final application film thickness) of the resin film 52, and the size (specifically, one droplet amount V of the ink droplet 152a from the nozzle 203a) and the nozzle pitch p2 of the nozzles 203a. For example, as illustrated in FIG. 1, when it is assumed that the pitch of the recesses and the protrusions in the recessed and protruding portion 132A is P2 (μm), the pitch P2 of the recesses and the protrusions is desirably equal to the nozzle pitch p2 (μm) (i.e., P2=p2). Note that the pitch P2 of the recesses and the protrusions in the recessed and protruding portion 132A indicates a period of the recesses and the protrusions, i.e., a distance between the centers of the adjacent recessed portions 132a in the recesses and the protrusions in the plan view or a distance between the centers of the adjacent protruding portions 132b. Note that the distance between the centers of the adjacent recessed portions 132a and the distance between the centers of the adjacent protruding portions 132b are equal.

Further, when it is assumed that the depth of the recesses and the protrusions in the recessed and protruding portion 132A is D2 (μm), the depth D2 of the recesses and the protrusions is desirably half the application pitch p1 (μm). Note that, when it is assumed that the application frequency of the ink droplet 152a in the ink-jet coating device 200 is f (1/s), and the scanning speed of the film formed substrate 100 is v (μm/s), the application pitch p1 is indicated by p1=v/f. Therefore, the depth D2 of the recesses and the protrusions described above is desirably D2=p1/2=v/(2×f). Note that the depth D2 of the recesses and the protrusions in the recessed and protruding portion 132A indicates a depth of the recesses and the protrusions that is a distance between a line connecting the adjacent recessed portions 132a and a line connecting the adjacent protruding portions 132b in the plan view, i.e., a clearance in a recessed and protruding direction (left-right direction in FIG. 1) between the center of the recessed portion 132a described above and the center of the protruding portion 132b described above in the plan view.

On the other hand, when it is assumed that the pitch of the recesses and the protrusions in the recessed and protruding portion 131A is P1 (μm), the pitch P1 is desirably equal to the application pitch p1. In other words, it is desirable that P1=p1=v/f. Note that the pitch P1 of the recesses and the protrusions in the recessed and protruding portion 131A indicates a period of the recesses and the protrusions, i.e., a distance between the centers of the adjacent recessed portions 131a in the recesses and the protrusions in the plan view or a distance between the centers of the adjacent protruding portions 131b. Note that the distance between the centers of the adjacent recessed portions 131a and the distance between the centers of the adjacent protruding portions 131b are equal.

Further, when it is assumed that the depth of the recesses and the protrusions in the recessed and protruding portion 131A is D1 (μm), the depth D1 of the recesses and the protrusions is desirably set such that all of the shortest distances x between the center of each of the recessed portions 132a and the center of each of the protruding portions 132b in the recessed and protruding portion 131A, and each of the ink droplets 152a adjacent to the recessed portion 132a and the protruding portion 132b are equal. At this time, since a relationship of $x^2=(p2/2-x)^2+\{v/(2\times f)\}^2$ holds true, $x=p/4+v^2/(4\times p\times f^2)$. Thus, when it is assumed that the depth of the recesses and the protrusions in the recessed and protruding portion 131A is D1 (μm), the depth D1 of the recesses and the protrusions is desirably $D1=2\times x-p/2=v^2/(2\times p2\times f^2)$. Note that $v^2/f^2$ can be replaced with $p1^2$ (square of p1). Note that the depth D1 of the recesses and the protrusions in the recessed and protruding portion 131A indicates a depth of the recesses and the protrusions that is a distance between a line connecting the adjacent recessed portions 131a and a line connecting the adjacent protruding portions 131b in the plan view, i.e., a clearance in a recessed and protruding direction (up-down direction in FIG. 1) between the center of the recessed portion 131a described above and the center of the protruding portion 131b described above in the plan view.

Further, when it is assumed that the film thickness of the resin film 52 is t (μm), the number of times of dropping onto an identical region of the film formed substrate 100 by the ink-jet coating device 200 is n (times), one droplet amount of the ink droplet 152a from the nozzle 203a is V (p1), and, as described above, the nozzle pitch is p2 (μm), the application pitch is p1 (μm), and the application frequency is f (Us), and the scanning speed is v (μm/s), the application film thickness of the ink droplet 152a film-formed by a single scan is acquired by dividing one droplet amount of the ink droplet 152a by an area occupied by the one droplet amount, and thus the film thickness t of the resin film 52 that is film-formed in the end is $t=V\times10^3\times n/(p2\times p1)= V\times10^3\times n/(p2\times v/f)$. Therefore, the pitch P1 of the recesses and the protrusions in the recessed and protruding portion 131A is desirably set such that $P1=v/f=V\times10^3\times n/(p2\times t)= V\times10^3\times n/(P2\times t)$. Further, the pitch P2 of the recesses and the protrusions in the recessed and protruding portion 132A is desirably set such that $P2=p2=V\times10^3\times n/(t\times v/f)= V\times10^3\times n/(t\times P1)$. The depth D2 of the recesses and the protrusions in the recessed and protruding portion 132A is desirably set to be half of the pitch P1 of the recesses and the protrusions in the recessed and protruding portion 131A, i.e., set such that $D2=V\times10^3\times n/(p2\times 2\times t)=v\times10^3\times n/(P2\times 2\times t)$.

For example, when it is assumed that nozzle pitch p2=70.5 μm, film thickness t of the resin film 52=10 μm, number n of times of dropping onto an identical region=2 times, one droplet amount V of the ink droplet 152a from the nozzle 203a=10 pl, application frequency f=21.15 kHz, and scanning speed $v=600\times10^3$ μm/s, it is desirable that pitch P2 of the recesses and the protrusions=70.5 μm and depth D2 of the recesses and the protrusions=14.2 μm in the recessed and protruding portion 132A. Further, it is desirable that pitch P1 of the recesses and the protrusions=28.4 μm and depth D1 of the recesses and the protrusions=5.7 μm in the recessed and protruding portion 131A.

Advantageous Effects

As described above, in the present embodiment, the recessed and protruding portion 133 having sizes (pitch and depth) of the recesses and the protrusions different on the first side 131 and the second side 132 is provided on the circumferential end portion of the flattening layer 13, and the ink droplet 152a is applied (dropped) according to the recessed and protruding portion 133. As illustrated in FIG. 1, the ink droplet 152a is applied such that the ink droplet 152a on the flattening layer 13 among the ink droplets 152a adjacent to each side across each side of the flattening layer 13 faces the center of each of the protruding portions 131b and 132b, and the ink droplet 152a between the flattening layer 13 and the first bank 41 faces the center of each of the recessed portions 131a and 132a. According to the present embodiment, the recessed portions 131a and 132a are provided in a region in which the ink droplet 152a does not spread when the circumferential end portion of the flattening layer 13 is linear. Thus, a defect in the resin film 52 on the circumferential end portion of the flattening layer 13 can be suppressed.

Further, the ink 152 is more likely to stop at the end portion of the planar face, and when the end portion of the flattening layer 13 is linear as illustrated in FIG. 10, the ink 152 remains on the end portion of the upper face of the flattening layer 13 until action of gravity exceeds action of surface tension due to the action of the surface tension. However, according to the present embodiment, the recessed and protruding portion 133 is provided on the circumferential end portion of the flattening layer 13, and thus each edge (each side) of the flattening layer 13 is not formed as a continuous straight line from one end to the other end in the plan view and therefore, portions connected by straight lines are shorter than that in the past. The ink droplets 152a dropped onto the upper face of the flattening layer 13 flow on the flattening layer 13, wet-spread, and also overlap, and are leveled in the active area DA. Further, when the ink droplets 152a that wet-spread on the flattening layer 13 reach the recessed portions 131a and 132a, the ink droplets 152a flow down from the recessed portions 131a and 132a to below the flattening layer 13. When the ink 152 (ink droplet 152a) flows down from any one location to below the flattening layer 13, the ink 152 in the periphery also flows down together from the flattening layer 13. The recessed portions 131a and 132a induce a flow of the ink 152 downward from the upper face of the flattening layer 13. The ink droplet 152a dropped onto the region between the flattening layer 13 and the first bank 41 and the ink 152 flowing down from the upper face of the flattening layer 13 onto the region between the flattening layer 13 and the first bank 41 wet-spread in the region, reach the first bank 41, and are held back by the first bank 41. As a result, even when foreign matters infiltrate the region surrounded by the first bank 41, the foreign matters can be covered with the resin film 52 obtained from curing the ink 152 described above, and be leveled.

Therefore, according to the present embodiment, it is possible to provide the display device 1 capable of preventing a reduction in reliability caused by a defect in the resin film 52 that is an ink-jet resin film, and a manufacturing method of the display device 1. Note that, in the present embodiment, a case in which the arrangement of the ink droplets 152a is shifted by half of the application pitch p1 of the ink droplets 152a is described as an example, but the same concept can also be applied to other application methods.

Modified Example 1

Figure 11:
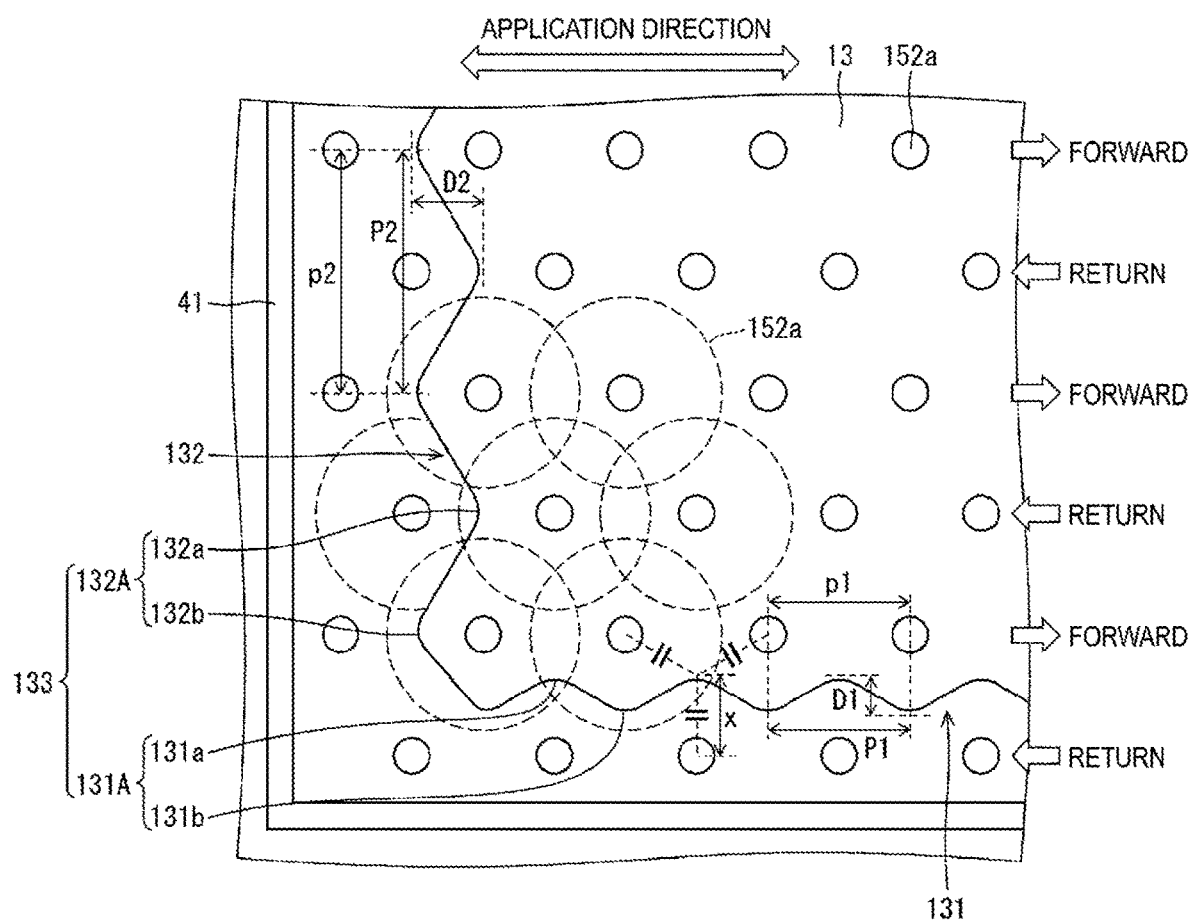
FIG. 11 is an enlarged plan view illustrating a schematic configuration of the main portions of the display device according to a modified example of the first embodiment together with the arrangement of the ink droplets when the resin film is film-formed.

FIG. 11 is an enlarged plan view illustrating a schematic configuration of the main portions of the display device 1 according to the present modified example together with the arrangement of the ink droplets 152a when the resin film 52 is film-formed. The ink droplets 152a spread radially. Thus, as illustrated in FIG. 11, the recessed and protruding portions 131A and 132A may have a curved shape (wavy shape) acquired by smoothening the zigzag shape illustrated in FIG. 1.

Modified Example 2

Further, in the present embodiment, as illustrated in FIG. 1 and FIG. 11, a case in which the pitch of the recesses and the protrusions in the recessed and protruding portion 132A provided on the second side 132 of the flattening layer 13 is wider than the pitch of the recesses and the protrusions in the recessed and protruding portion 131A provided on the first side 131 of the flattening layer 13 is described as an example. However, the present embodiment is not limited to this configuration, and the pitch of the recesses and the protrusions in the recessed and protruding portion 131A may be wider than the pitch of the recesses and the protrusions in the recessed and protruding portion 132A.

Second Embodiment

Another embodiment of the disclosure will be described as follows, with reference to FIG. 12 and FIG. 13. Note that members having the same functions as the functions of the members described in the first embodiment are denoted by the same reference signs, and description of such members will be omitted.

Figure 12:
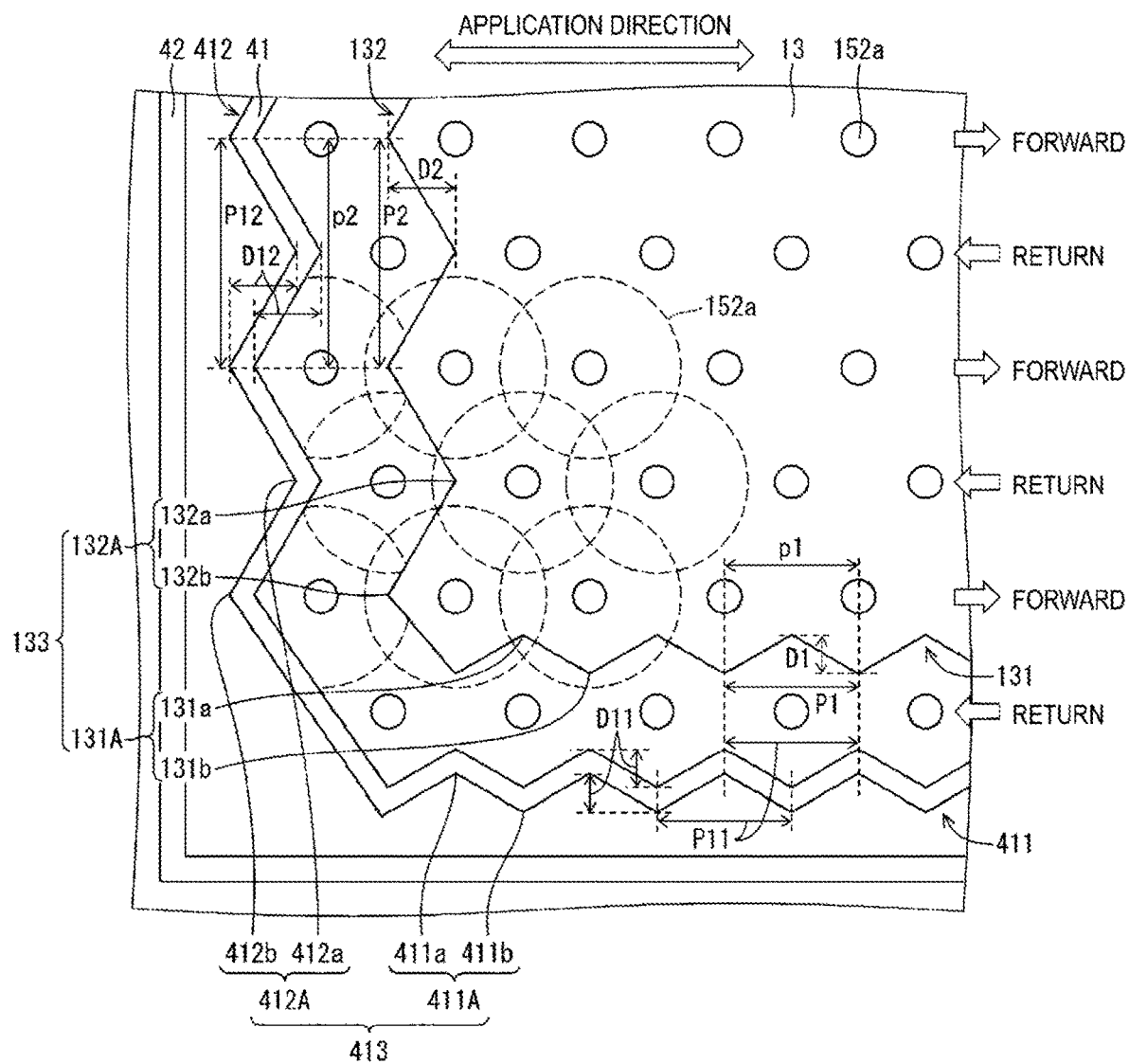
FIG. 12 is an enlarged plan view illustrating a schematic configuration of main portions of a display device according to a second embodiment together with an arrangement of ink droplets when a resin film is film-formed.

FIG. 12 is an enlarged plan view illustrating a schematic configuration of main portions of a display device 1 according to the present embodiment together with an arrangement of ink droplets 152a when a resin film 52 is film-formed. The display device 1 according to the present embodiment has a configuration that is identical to that of the display device 1 according to the first embodiment except for the following points. As described above, the ink droplets 152a are dropped to the inside of a first bank 41. For this reason, it is desirable that a recessed and protruding portion that conforms to a droplet shape of the ink droplets 152a is provided on the first bank 41. Thus, in the present embodiment, as illustrated in FIG. 12, a recessed and protruding portion 413 having sizes (pitch and depth) of recesses and protrusions different on a first side 411 of the first bank 41 parallel to a first side 131 of a flattening layer 13 and a second side 412 of the first bank 41 parallel to a second side 132 of the flattening layer 13 is provided across the entire periphery of the first bank 41.

The recessed and protruding portion 413 includes a recessed and protruding portion 411A formed of a recessed portion 411a and a protruding portion 411b provided on the first side 411, and a recessed and protruding portion 412A formed of a recessed portion 412a and a protruding portion 412b provided on the second side 412. The recessed and protruding portion 411A has a shape in which a recessed and protruding portion 131A is inverted in the up-down direction (second direction) such that the recessed portion 411a faces a protruding portion 131b of the flattening layer 13 and the protruding portion 411b faces a recessed portion 131a of the flattening layer 13. Further, the recessed and protruding portion 412A has a shape in which a recessed and protruding portion 132A moves in parallel in the left-right direction (first direction) such that the recessed portion 412a faces a recessed portion 132a of the flattening layer 13 and the protruding portion 412b faces a recessed portion 132b of the flattening layer 13. Thus, when it is assumed that a pitch of recesses and protrusions (the recessed portion 411a and the protruding portion 411b) in the recessed and protruding portion 411A is P11 (μm), and a depth of the recesses and the protrusions in the recessed and protruding portion 411A is D11 (μm), P11=P1 and D11=D1. Further, when it is assumed that a pitch of recesses and protrusions (the recessed portion 412a and the protruding portion 412b) in the recessed and protruding portion 412A is P12 (μm), and a depth of the recesses and the protrusions in the recessed and protruding portion 412A is D12 (μm), P12=P2 and D12=D2.

Modified Example

Figure 13:
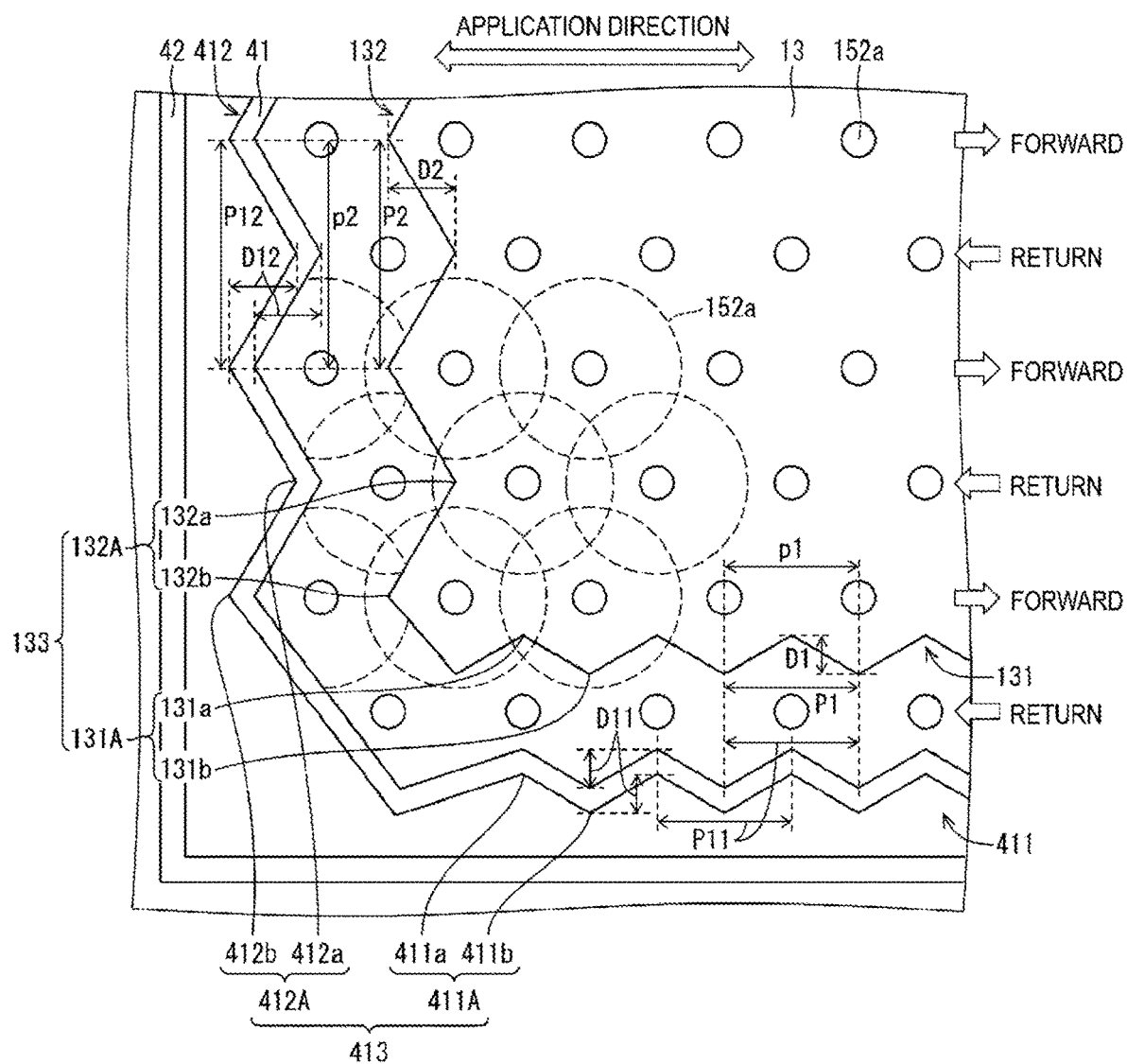
FIG. 13 is an enlarged plan view illustrating a schematic configuration of the main portions of the display device according to a modified example of the second embodiment together with the arrangement of the ink droplets when the resin film is film-formed.

FIG. 13 is an enlarged plan view illustrating a schematic configuration of the main portions of the display device 1 according to the present modified example together with the arrangement of the ink droplets 152a when the resin film 52 is film-formed. In the example illustrated in FIG. 12, the distance between the recessed and protruding portion 133 of the flattening layer 13 and the recessed and protruding portion 413 of the first bank 41 is not constant in the up-down direction and the left-right direction. However, the recessed and protruding portion 413 described above may be formed such that the distance between the recessed and protruding portion 133 of the flattening layer 13 and the recessed and protruding portion 413 of the first bank 41 is constant. Therefore, as illustrated in FIG. 13, the recessed and protruding portions 411A and 412A may have a shape in which the recessed and protruding portion 131A moves in parallel in the up-down direction and the recessed and protruding portion 132A moves in parallel in the left-right direction such that the recessed portion 411a faces the recessed portion 131a, the protruding portion 411b faces the protruding portion 131b, the recessed portion 412a faces the recessed portion 132a, and the protruding portion 412b faces the protruding portion 132b. Also in this case, as illustrated in FIG. 13, P11=P1 and D11=D1.

Third Embodiment

Another embodiment of the disclosure will be described as follows, with reference to FIG. 14. Note that members having the same functions as the functions of the members described in the first and second embodiments are denoted by the same reference signs, and description of such members will be omitted.

Figure 14:
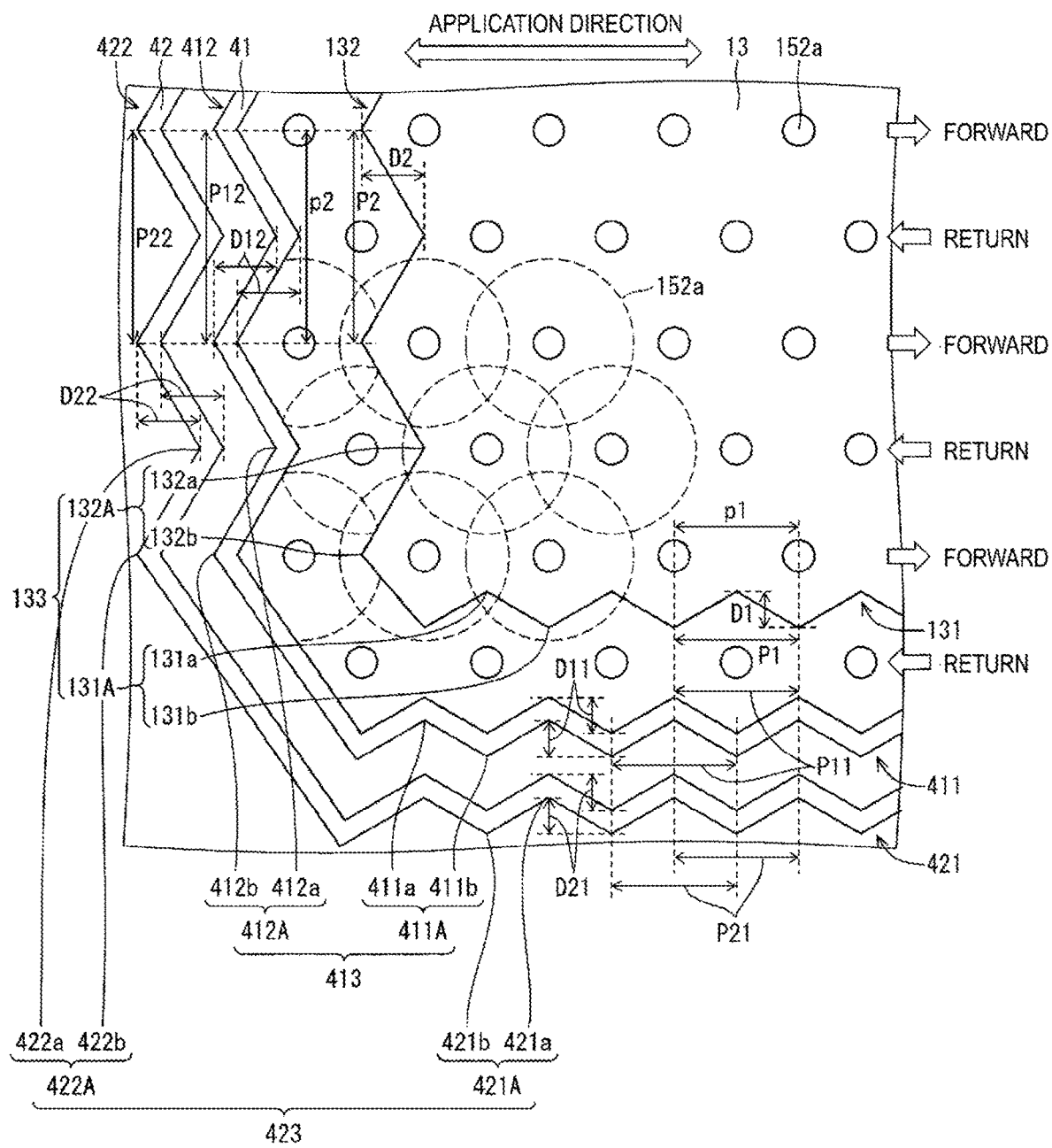
FIG. 14 is an enlarged plan view illustrating a schematic configuration of main portions of a display device according to a third embodiment together with an arrangement of ink droplets when a resin film is film-formed.

FIG. 14 is a plan view illustrating a schematic configuration of main portions of a display device 1 according to the present embodiment together with an arrangement of ink droplets 152a when a resin film 52 is film-formed. The display device 1 according to the present embodiment has a configuration that is identical to that of the display device 1 according to the first and second embodiments except for the following points.

A second bank 42 is desirably formed such that a distance between a first bank 41 and the second bank 42 is constant in order to prevent the ink droplets 152a that get over the first bank 41 from overflowing from the second bank 42. Thus, in the present embodiment, a recessed and protruding portion 423 having sizes (pitch and depth) of recesses and protrusions different on a first side 421 of the second bank 42 parallel to a first side 131 of a flattening layer 13 and a second side 422 parallel to a second side 132 of the flattening layer 13 is provided across the entire periphery of the second bank 42.

The recessed and protruding portion 423 includes a recessed and protruding portion 421A formed of a recessed portion 421a and a protruding portion 421b provided on the first side 421, and a recessed and protruding portion 422A formed of a recessed portion 422a and a protruding portion 422b provided on the second side 422. The recessed and protruding portion 421A has a shape in which a recessed and protruding portion 131A moves in parallel in the up-down direction (second direction). Further, the recessed and protruding portion 412A has a shape in which a recessed and protruding portion 132A moves in parallel in the left-right direction (first direction). Thus, when it is assumed that a pitch of recesses and protrusions (the recessed portion 421a and the protruding portion 421b) in the recessed and protruding portion 421A is P21 (μm), and a depth of the recesses and the protrusions in the recessed and protruding portion 421A is D21 (μm), P21=P1=P11 and D21=D1=D12. Further, when it is assumed that a pitch of recesses and protrusions (the recessed portion 422a and the protruding portion 422b) in the recessed and protruding portion 422A is P22 (μm), and a depth of the recesses and the protrusions in the recessed and protruding portion 422A is D22 (μm), P22=P2=P12 and D22=D2=D12.

The disclosure is not limited to each of the embodiments described above, and various modifications may be made within the scope of the claims. Embodiments obtained by appropriately combining technical approaches disclosed in each of the different embodiments also fall within the technical scope of the disclosure. Moreover, novel technical features can be formed by combining the technical approaches disclosed in the embodiments.

The invention claimed is:

1. A display device comprising:
    a circuit substrate including a flattening layer provided on a surface;
    a plurality of light-emitting elements provided on the flattening layer;
    a sealing film including a first inorganic film, a resin film in an upper layer overlying the first inorganic film, and a second inorganic film in an upper layer overlying the resin film, the sealing film sealing the light-emitting element; and
    a first bank surrounding the flattening layer, the first bank being covered with the resin film on an inner side, the first bank having a frame shape,
    wherein the flattening layer includes a first side and a second side orthogonal to the first side, and includes, on an entire periphery of a circumferential end portion of the flattening layer, a recessed and protruding portion provided with recesses and protrusions having sizes different on the first side and the second side in a plan view.

2. The display device according to claim 1,
    wherein the recessed and protruding portion has a pitch of the recesses and the protrusions that is a distance between the centers of adjacent recessed portions in the recesses and the protrusions in the plan view or a distance between the centers of adjacent protruding portions, and a depth of the recesses and the protrusions that is a clearance in a recessed and protruding direction between the center of the recessed portion and the center of the protruding portion in the plan view, the pitch and the depth being different on the first side and the second side.

3. The display device according to claim 1,
    wherein the recessed and protruding portion has a zigzag shape in the plan view.

4. The display device according to claim 1,
    wherein the recessed and protruding portion has a curved shape in the plan view.

5. The display device according to claim 1,
    wherein a recessed and protruding portion having a shape in which the recessed and protruding portion on the first side is inverted or moves in parallel in a direction vertical to the first side is provided on a side parallel to the first side in the first bank having a frame shape, and a recessed and protruding portion having a shape in which the recessed and protruding portion on the second side moves in parallel is provided on a side parallel to the second side in the first bank.

6. The display device according to claim 1, further comprising
    a second bank surrounding the first bank,
    wherein a recessed and protruding portion is provided on each of a side parallel to the first side and a side parallel to the second side in the second bank, a distance between the first bank and the second bank being constant.

7. A manufacturing method of a display device including:
a circuit substrate including a flattening layer provided on a surface; a plurality of light-emitting elements provided on the flattening layer; a sealing film including a first inorganic film, a resin film in an upper layer overlying the first inorganic film, and a second inorganic film in an upper layer overlying the resin film, the sealing film sealing the light-emitting element; and a first bank surrounding the flattening layer, the first bank being covered with the resin film on an inner side, the flattening layer including a first side and a second side orthogonal to the first side, the manufacturing method comprising:
    a step of forming the flattening layer;
    a step of forming the first bank that surrounds the flattening layer; and
    a step of forming the resin film that covers the inner side of the first bank,
    wherein a recessed and protruding portion having different sizes in the plan view on the first side and the second side is formed on an entire periphery of a circumferential end portion of the flattening layer in the step of forming the flattening layer, and
    an ink droplet is dropped from an ink-jet coating device according to the recessed and protruding portion in a region surrounded by the first bank in the step of forming the resin film.

8. The manufacturing method of a display device according to claim 7,
    wherein, in the step of forming the resin film,
    the second side is a side vertical to an application direction of the ink droplet, and when it is assumed that a pitch of a nozzle that drops the ink droplet in the ink-jet coating device is p2 (μm), an application frequency of the ink droplet is f (l/s), a scanning speed is v (μm/s), a pitch of the recesses and the protrusions in the plan view in the recessed and protruding portion on the second side is P2 (μm/s), and a depth of the recesses and the protrusions in the plan view in the recessed and protruding portion on the second side is D2 (μm), P2=p2 and D2=v/(2×f).

9. The manufacturing method of a display device according to claim 8,
    wherein, in the step of forming the resin film,
    when it is assumed that the number of times of dropping onto an identical region by the ink-jet coating device is n (times), one droplet amount of an ink droplet from the nozzle is V (pl), and a film thickness of the resin film is t (μm), P2=V×10³×n/(t×v/f) and D2=V×10³×n/(p2× 2×t).

10. The manufacturing method of a display device according to claim 8,
    wherein, in the step of forming the resin film,
    the first side is a side parallel to an application direction of the ink droplet, and when it is assumed that a pitch of the recesses and the protrusions in the plan view in the recessed and protruding portion on the first side is P1 (m/s), and a depth of the recesses and the protrusions in the plan view in the recessed and protruding portion on the first side is D1 (μm), P1=v/f and D1= v²/(2×p2×f²).

* * * * *